(12) United States Patent
Kirk

(10) Patent No.: US 7,887,379 B2
(45) Date of Patent: *Feb. 15, 2011

(54) DIFFERENTIAL PAIR INVERSION FOR REDUCTION OF CROSSTALK IN A BACKPLANE SYSTEM

(75) Inventor: Brian Peter Kirk, Amherst, NH (US)

(73) Assignee: Amphenol Corporation, Wallingford, CT (US)

( * ) Notice: Subject to any disclaimer, the term of this patent is extended or adjusted under 35 U.S.C. 154(b) by 11 days.

This patent is subject to a terminal disclaimer.

(21) Appl. No.: 12/575,243

(22) Filed: Oct. 7, 2009

(65) Prior Publication Data

US 2010/0093227 A1    Apr. 15, 2010

Related U.S. Application Data

(63) Continuation of application No. 12/015,369, filed on Jan. 16, 2008, now Pat. No. 7,607,951.

(51) Int. Cl.
   *H01R 24/00* (2006.01)
(52) U.S. Cl. ..................................... 439/676
(58) Field of Classification Search .................. 439/676, 439/941
   See application file for complete search history.

(56) References Cited

U.S. PATENT DOCUMENTS

| 6,394,822 | B1 | 5/2002 | McNamara |
| 6,872,085 | B1 | 3/2005 | Cohen et al. |
| 7,341,493 | B2 | 3/2008 | Pepe et al. |
| 2006/0067067 | A1 | 3/2006 | Heard |
| 2006/0073709 | A1 | 4/2006 | Reid |

OTHER PUBLICATIONS

D. Brooks, Crosstalk, part 1 Understanding Forward v. Backward, UltraCAD Design, Inc., pp. 1-4, Nov. 2003, Mentor Graphics, www.mentor.com.

*Primary Examiner*—Truc T Nguyen
(74) *Attorney, Agent, or Firm*—Blank Rome LLP

(57) ABSTRACT

A connection system has two connectors connected to each other by a plurality of differential signal pairs. The differential signal pairs alternate between a "straight connection" and a "reverse connection" between the connectors. The "straight connection" is formed by having a first signal trace connected from a positive launch in the first connector to a positive launch in the second connector, or P-P. And, the second signal trace has an N-N connection. The "reverse connection" has a first signal trace connected from a positive launch in the first connector to a negative launch in the second connector, or P-N. And, the second signal trace has a N-P connection. By inverting the pin connections of every other differential signal pair on the backplane, the forward crosstalk from the first connector is cancelled by the crosstalk generated by the second connector.

19 Claims, 6 Drawing Sheets

DIFFERENTIAL PAIR INVERSION FOR REDUCTION OF CROSSTALK IN A BACKPLANE SYSTEM

RELATED APPLICATION

The present application is a continuation of U.S. Ser. No. 12/015,369 U.S. Pat. No. 7,607,951, filed Jan. 16, 2008, the contents of which are hereby incorporated by reference in its entirety.

BACKGROUND OF THE INVENTION

1. Field of the Invention

The present invention relates to a system for reducing crosstalk in a backplane. More particularly, the present invention reverses pin connections of traces extending between connectors on a backplane to reduce crosstalk.

2. Background of the Related Art

Electronic systems are often assembled from multiple printed circuit boards (PCB). Each connection device, which is sometimes called a "daughter card," contains electronic components. The daughter card includes one or more electronic components. The daughter card includes one or more electrical connectors that allow the circuits on the daughter card to be connected to other circuits in the system.

Often, electrical signals are routed from one daughter card to another through a backplane. A backplane is a printed circuit board with conducting paths, called "signal traces" or just "traces," such as a wire. Connectors are mounted on the backplane to make connection to the traces. When the connectors on the daughter cards are mated with the connectors on the backplane, signal paths are established between the daughter cards. The portion of a printed circuit board that allows a trace to be connected to a contact element in a connector or other electronic element is called a "signal launch" or "launch."

As electronic systems have become smaller, faster and more complex, this has generally required that backplanes provide more signal traces without increasing in size, or while actually decreasing in size. As a result, electrical noise becomes more problematic. Electrical noise is usually considered any undesirable electrical energy in an electronic system, including but not limited to, reflections, electromagnetic interference, mode conversions and unwanted coupling, such as crosstalk.

The trend for smaller, faster and more complex electronic systems has also required connectors to carry more and faster data signals in a smaller space without degrading the electrical characteristics of the signal. Connectors can be made to carry more signals in less space by placing signal conductors in a connector closer together. A major difficulty with placing signal conductors closer together is that electrical noise between the signal conductors increases as the distance between signal conductors decreases and as the speed of the signals increases. In addition, as frequency content increases, there is a greater possibility of energy loss. Energy loss may be attributed to impedance discontinuities, mode conversion, leakage from imperfect shielding, or undesired coupling to other conductors such as crosstalk.

Differential signals are signals represented by a pair of conducting paths, called a "differential pair." The voltage difference between the conductive paths represents the signal. In general, the two conducing paths of a differential signal pair are arranged to run near each other. If any other source of electrical noise is electromagnetically coupled to the differential signal pair, the effect on each conducting path of the pair should be similar. Because the signal on the differential signal pair is treated as the difference between the voltages on the two conducting paths, a common noise voltage that is coupled to both conducting paths in the differential signal pair does not affect the signal. This renders a differential signal pair less sensitive to crosstalk noise, as compared with a single-ended signal path. At high speeds, the available electrical connector may encounter crosstalk, impedance and attenuation mismatch characteristics. And the signal transmission characteristics degrade.

Crosstalk generally refers to electromagnetic interference that comes from an adjacent wire. Current that flows down one of the traces, referred to as the aggressor line, couples into the adjacent trace, called the victim line, and creates two different noise signals in the victim line. One of the noise signals, called "forward crosstalk" or "far end crosstalk," flows in the victim line in the same direction as the current flowing in the aggressor line. The other noise signal, called "backward crosstalk," flows in the victim line in the opposite or backward direction as the current flowing in the aggressor line.

Referring to FIG. 1(a), a standard backplane connection system 100 is shown having a first connector 110 and a second connector 120 with various traces. The first connector 110 has inputs receiving traces 130, 132. Traces 134, 136 are provided to connect the first connector 110 and the second connector 120. And, the second connector 120 has output traces 138, 140.

The impact of crosstalk on the system 100 is exemplified in FIGS. 1(b)-(i). In the embodiment of FIG. 1(a), the bottom traces 130, 134, 138 are the aggressor traces and the top traces 132, 136, 140 are the victim traces. Once the signal on the aggressor line pair 130 reaches the first connector 10, FIG. 1(b), noise in the form of crosstalk is created at the first connector 110, as shown in FIG. 1(c). The noise is generated inside the first connector 110, which has coupling between pairs. Noise is also generated in the footprint of the connector 110, which is the portion of the Printed Wiring Board (PWB) that the connector 110 is pressed into. The connector 110 has attachments to the board, such as surface-mount or compliant pin. In addition, the vias created in the board are cylinders through the thickness of the board. These via cylinders can also couple to each other and generate noise. This effect is directly related to the thickness of the board, whereby the thicker the board is, the more crosstalk that is generated. For a thick board, the crosstalk in the board can be greater than the crosstalk from the connector.

There is no noise on the second connector 120 at this point, FIG. 1(d), so that the noise at the first connector 110 is the total noise for the system, FIG. 1(e). The noise from the first connector 110 continues at the output of the first connector 110 on the victim trace 136.

Once the signal reaches the second connector 120, FIG. 1(f), there is the noise on the victim trace 136 from the first connector 110, FIG. 1(g), and the noise that is generated at the second connector 120, FIG. 1(h). Noise is generated in the second connector 120 the same as it is generated in the first connector 110, i.e., due to the coupling between pairs, the footprint attachments, and the via cylinder coupling. The noise on victim trace 136 and the noise on the second connector 120 get combined inside the second connector 20. Thus, the total noise in the system 100, FIG. 1(i), is about doubled that at each connector 110, FIGS. 1(g), (h).

While it is possible to minimize the deleterious coupling effects by adding space between the victim and aggressor lines, that comes at the disadvantage of losing density in the backplane. Thus, as ever more signals are populated onto the card, the problem with coupling becomes more probable and problematic.

In a backplane environment, the lines 130, 132 coming into the first connector 110 can be, for instance, from a line card of a router, or a processor card. The lines 138, 140 out from the second connector 120 can be to a fabric card or a switch card.

SUMMARY OF THE INVENTION

Accordingly, it is one object of the invention to reduce the crosstalk on a connector backplane. It is a further object of the invention to provide a connection system where the differential pair connections between connectors are reversed to cancel noise generated by successive connectors. It is another object of the invention to reduce noise present on signal conductors between connectors. It is yet another object of the invention to provide a connection system that allow connectors to increase in speed and density without degrading the electrical characteristics of the signals.

In accordance with these and other objectives, a connection system is provided with two connectors. A plurality of differential signal pairs connect the connectors. The differential signal pairs alternate between a "straight connection" and a "reverse connection" between the connectors. The "straight connection" is formed by having a first signal trace connected from a positive launch in the first connector to a positive launch in the second connector, or P-P. And, the second signal trace is connected to a negative launch at the first connector and a negative launch at the second connector, or N-N.

The "reverse connection" has a "reversed connection" where the first signal trace connects from a positive launch in the first connector to a negative launch in the second connector, or P-N. And, the second signal trace connects from a negative launch in the first connector to a positive launch in the second connector, or a N-P.

By inverting the pin connections of every other differential signal pair on the backplane, the forward crosstalk pulse of the second connector is the opposite polarity to the crosstalk pulse on the first connector. Accordingly, the crosstalk from the first connector is cancelled by the crosstalk generated by the second connector. The pin connections of the traces are able to be reversed since the signal on each trace of the differential signal pairs is immaterial. It is the voltage difference on those pairs that is measured and not the signal on any one trace. Because the differential signal pairs and launches are physically close to each other, noise in the system is likely to affect each pair the same way.

These and other objects of the invention, as well as many of the intended advantages thereof, will become more readily apparent when reference is made to the following description, taken in conjunction with the accompanying drawings.

DETAILED DESCRIPTION OF THE PREFERRED EMBODIMENTS

Figure 1:
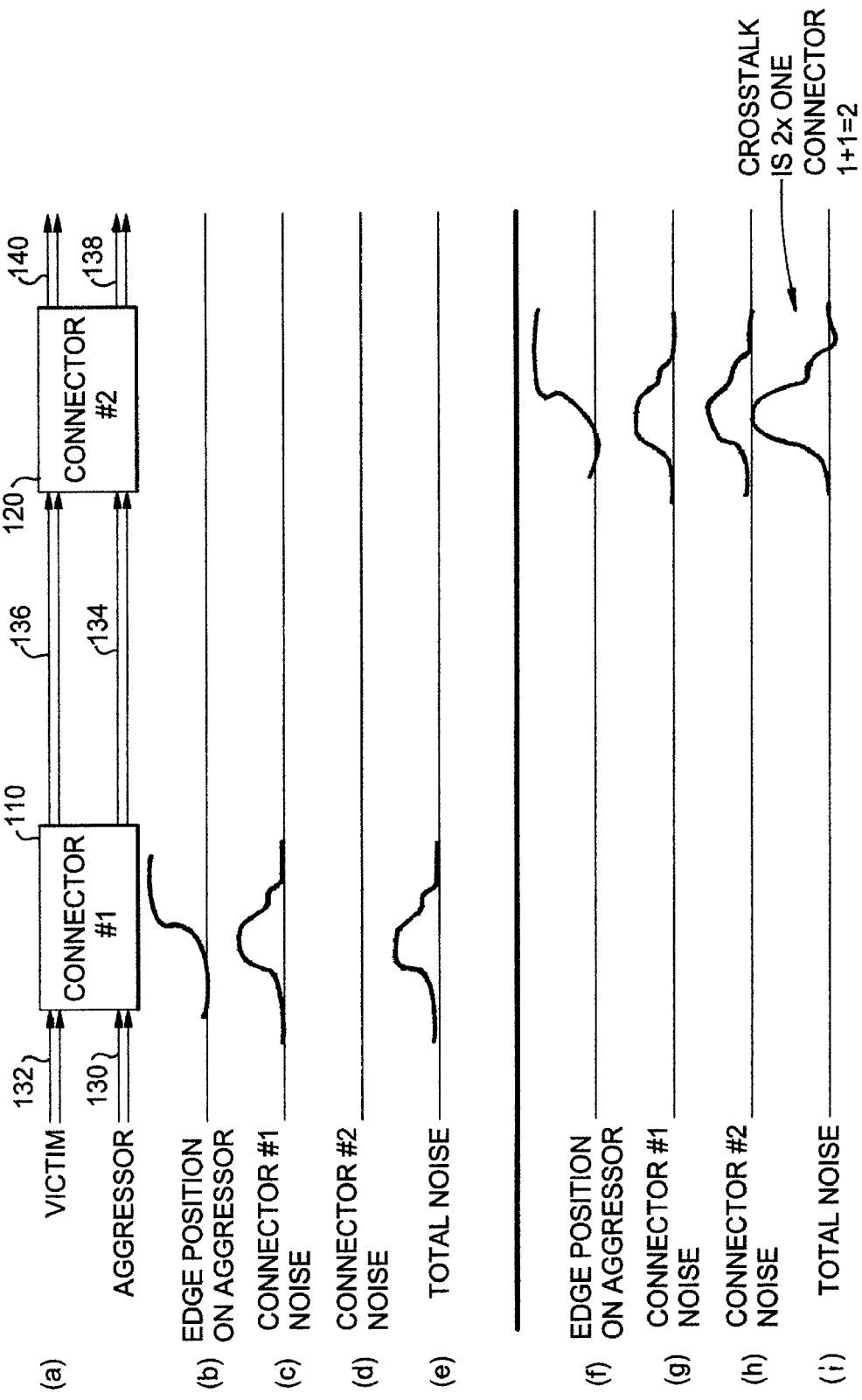
FIGS. 1(a)-(i) depict crosstalk encountered in a conventional system.

In describing a preferred embodiment of the invention illustrated in the drawings, specific terminology will be resorted to for the sake of clarity. However, the invention is not intended to be limited to the specific terms so selected, and it is to be understood that each specific term includes all technical equivalents that operate in a similar manner to accomplish a similar purpose.

Figure 2:
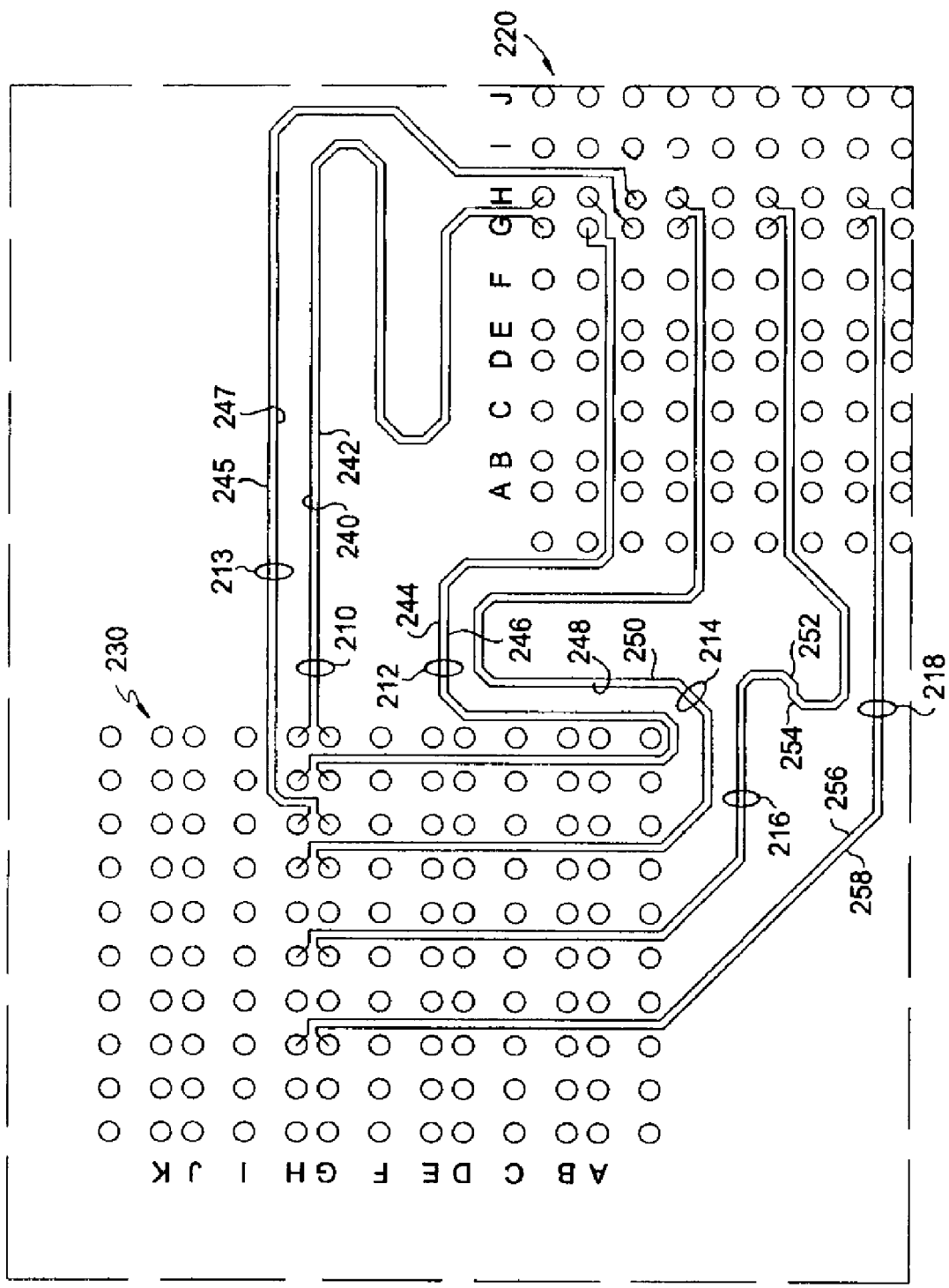
FIG. 2 is a printed circuit board view showing PN reversal of traces in accordance with the preferred embodiment of the invention.

Turning to the drawings, FIG. 2 shows a connection system 200 having a first connector 220 and a second connector 230 in accordance with a preferred embodiment of the invention. The first connector 220 and the second connector 230 each have a number of signal launches, here shown as an array of eleven rows (A-K) and ten columns (1-10). Differential signal pairs of launches are located closer to each other than to neighboring launches, such as are found in rows A-B, D-E, G-H, and J-K for the connectors 220, 230. For instance, the launches in rows A and B are close to each other than to the launch in row C. This permits greater coupling of the differential pairs.

The differential signal pair launches receive differential signal traces. Five differential signal trace pairs are shown in FIG. 2, labeled as elements 210, 212, 214, 216, 218, with each differential signal pair 210-218 having respective signal traces 240-258. The launches between the differential signal pairs are ground connections shown, for instance, in rows C, F, and I of the connectors 220, 230. The connection system 200 is preferably implemented on a backplane, though any suitable implementation can be made such as on a midplane or daughter card.

The first differential signal pair 210 includes traces 240, 242 that extend between the first connector 220 and the second connector 230. The first trace 240 connects at the launches found in column H of the first and second connectors 220, 230. And, the second trace 242 connects at the launches found in column G of the first and second connectors 220, 230. For illustrative purposes, the launches in column H all contain the positive (P) signal of the differential signal pair, and the launches in column G all have the negative (N) signal of the differential signal pair. Thus, the first trace 240 connects from a positive launch to a positive launch, or P-P, and the second trace 242 connects from a negative launch to a negative launch, or N-N. That direct P to P and N to N mapping from one location to another location is the way connectors are conventionally connected to each other on a backplane, and is generally referred to herein as a straight connection.

That straight connection is also utilized for every other differential signal pair extending between the first and second connectors 220, 230 of the system 200, such as for the third differential signal pair 213. However, every other differential signal pair 212, 214, 216, 218 has a reverse connection whereby the pin connections of its traces are reversed. For instance, the differential signal pair 212 has two traces 244, 246. The first trace 244 connects at the launch found in column H of the first connector 220. But, the other end of the trace connects to the second connector 230 at the launch in column G. And, the second trace 246 connects at the launch in column G of the first connector 220, but at the launch found in column H of the second connector 230. Thus, the second trace 246 is connected to different launches of the first and second connectors 220, 230, and the second trace 246 is connected in a reverse fashion than the first trace 244. So, the first trace 244 connects to a launch having a negative signal in the first connector 220 to a launch having a positive signal in the second connector 230, or P-N. And, the second trace 246 has a N-P connection.

Thus, the straight connection for a given trace has the same polarity connection at both ends. It extends from a launch in one column of the first connector 220 to a launch in the same respective column of the second connector 230 (from columns H-to-H and columns G-to-G in the given example). But, a trace having a reverse connection has opposite polarity connections at its ends. It extends from one column in the first connector 220 to the column of its respective trace in the second connector 230 (from columns G-to-H and from columns H-to-G in the given example).

By inverting the pin connections of every other differential signal pair on the backplane, the forward crosstalk pulse of the second connector 230 is the opposite polarity to the crosstalk pulse on the first connector 220. Accordingly, the crosstalk from the first connector 220 is cancelled by the crosstalk generated by the second connector 230. The pin connections of the traces are able to be reversed since the signal on each trace of the differential signal pairs is immaterial. It is the voltage difference on those pairs that is measured and not the signal on any one trace.

It should be noted that there is some crosstalk that is generated between the lines (i.e., traces) on the board. However, that is small compared to the amount of crosstalk that is generated at the connector footprint and connector, which is recognized at the vias on the board. Because the differential signal pair vias are physically close to each other, the noise in the system is likely to affect each pair the same way. It is not important that the trace lines themselves be physically close to one another.

Turning to FIGS. 3(a)-(i), an illustrative embodiment of the invention is shown. The system 200 has a first connector 220, second connector 230 and traces connected to the first and second connectors 220, 230. In the present preferred example, the aggressor traces connecting the first and second connectors 220, 230 correspond to the traces 244, 246 of the trace pair 212 in FIG. 2. And, the victim traces connecting the first and second connectors 220, 230 correspond to the traces 240, 242 of trace pair 210 in FIG. 2. Thus, the aggressor trace pair 212 is a reversed connection with respect to the victim trace pair 210, which is a straight connection.

As in FIG. 1, noise is created at the first connector 220, FIGS. 3(b), 3(c), due to the crosstalk on the victim trace pair from the aggressor trace pair. At this point, the signal has not reached the second connector 230, FIG. 3(d), so the total noise is due to the noise on the first connector 220, FIG. 3(e). Turning to FIG. 3(f), the signal on the aggressor trace pair has now reached the second connector 230. Since the trace pair is reversed, the aggressor signal after the first connector 220 has an inverse polarity with respect to the aggressor signal on the trace prior to the first connector 220. In the present example, the noise from the first connector 220 is positive, and the noise at the second connector 230 is negative.

The noise from the first connector 220 is present at the second connector 230, FIG. 3(g). In addition, the second connector 230 generates noise from the crosstalk on the aggressor trace on the victim trace, FIG. 3(h). However, the noise at the second connector 230 has an inverse polarity with respect to the noise that is present from the first connector 220. Thus, the noise from the second connector 230, FIG. 3(h), substantially cancels the noise from the first connector 220, FIG. 3(g), so that the total noise from the system is substantially reduced, as shown in FIG. 3(i).

In practice, the total noise, FIG. 3(i), is approximately ten percent (10%) of the total noise, FIG. 1(i), that would have otherwise been encountered. Accordingly, if the total noise of a straight connection, FIG. 1(i), is 100 mv, then the total noise due to the reverse connection, FIG. 3(i), is approximately 10 mv. It is further noted that the reverse connection is made for every other trace pair 212, 214. Traces 213 will aggress both of traces 212 and 214, but the reverse connection of every other pair will offset the noise on both of the traces 212, 214.

Figure 3:
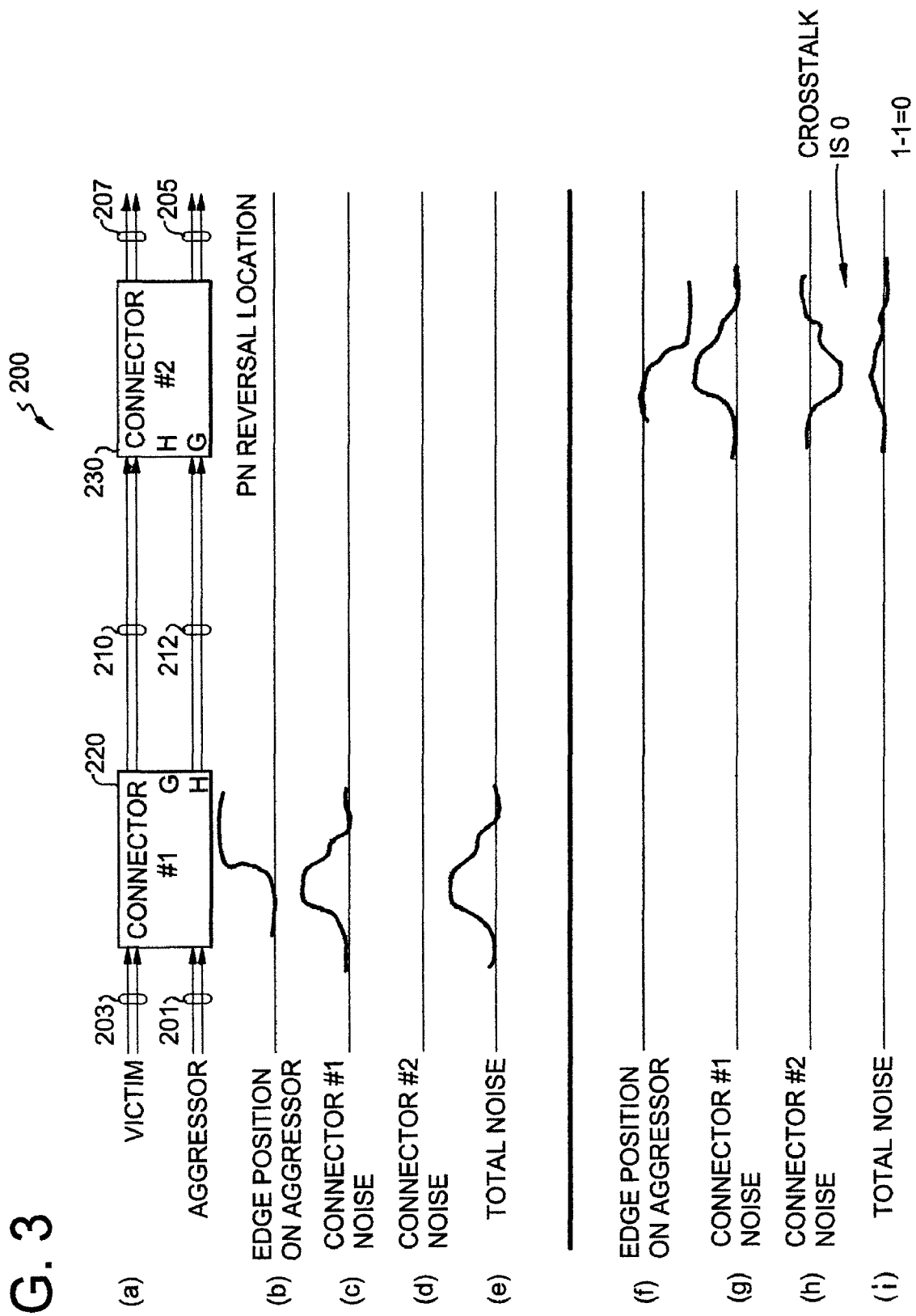
FIGS. 3(a)-(i) shows the reduction of crosstalk through the PN reversal of the aggressor line between the connectors of FIG. 2.
Figure 4:
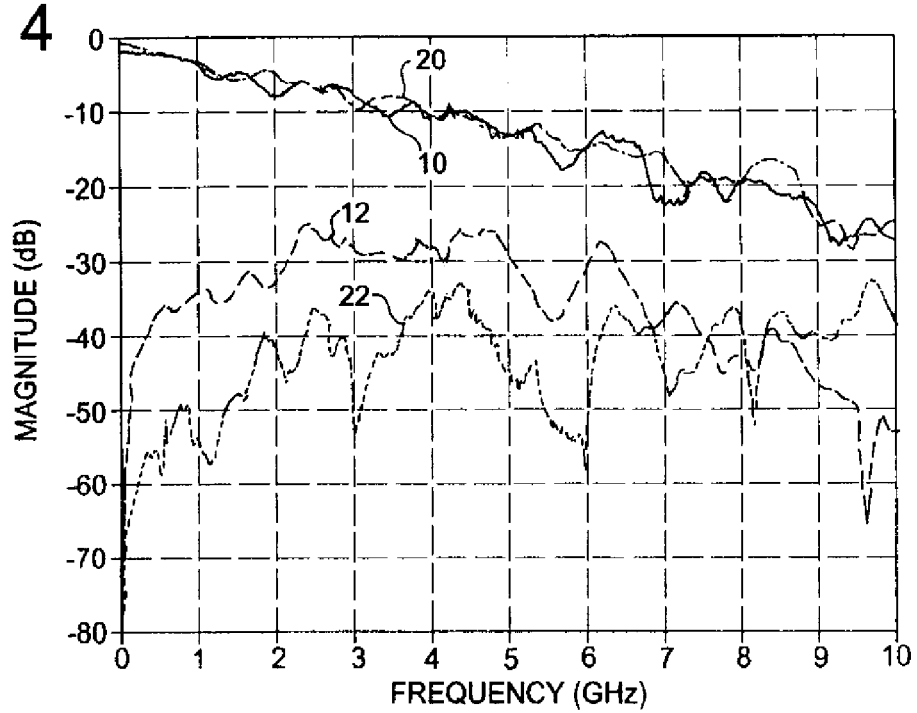
FIG. 4 is a chart showing the reduction of crosstalk achieved by the invention, while maintaining the signal energy level.

Now referring to FIG. 4, the reduced crosstalk is further illustrated. The plot shows the magnitude of total noise (i.e., crosstalk) measured against frequency. Lines 10, 12 corresponds to the prior art system 100 of FIG. 1, and lines 20, 22 correspond to the system 200 of FIG. 3. Lines 10, 20 represents the energy level of the signals, and lines 12, 22 represents the total noise, FIGS. 1(i) and 3(i) for the systems 100, 200, respectively. The energy levels of both systems, lines 10, 20, are essentially the same. However, the noise present in the system 200 is reduced to about 10% of the noise present in the system 100. As an example, at 2.3 GHz, the embodiment of FIG. 3 has a magnitude of approximately −30 dB, and the convention method of FIG. 1 has a magnitude of about −48 dB. Since dB is a log scale and 0 dB is essentially 1, crosstalk that is −20 dB means that it is 20 dB lower than the initial signal level. Thus, −20 dB is a factor of 10, −40 dB is a factor of 100, −6 dB is 2, and −12 dB is 4. So the difference between −30 dB and −48 dB is approximately a factor of 10. Thus, while the energy level is not affected, the noise is substantially canceled from 0 GHz up to about 5-6 GHz.

Figure 5:
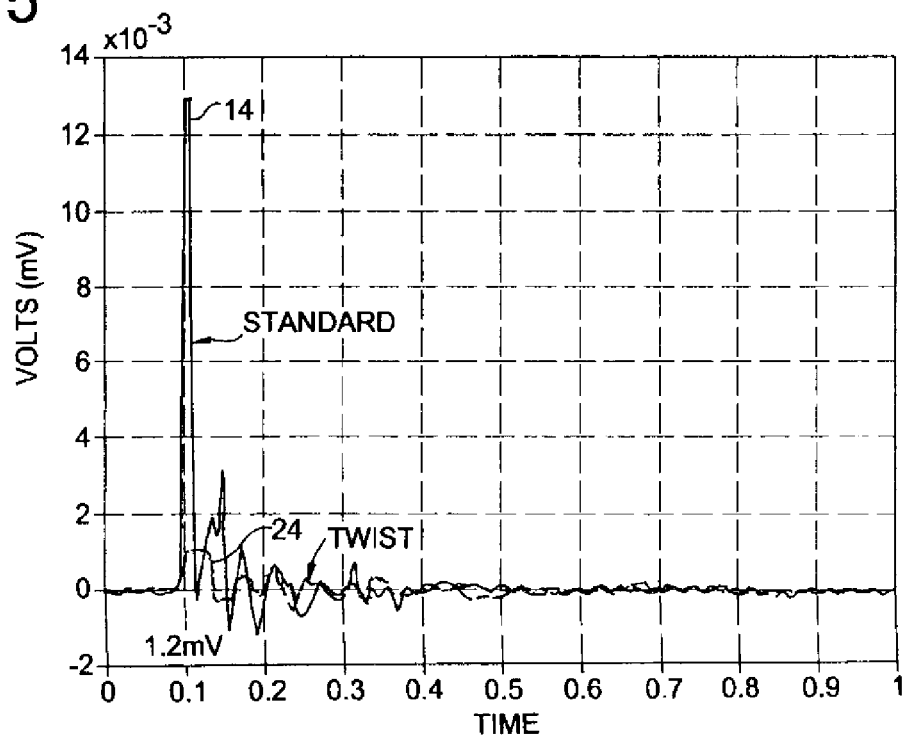
FIG. 5 is a chart showing the reduction of voltage achieved by the invention.
Figure 6:
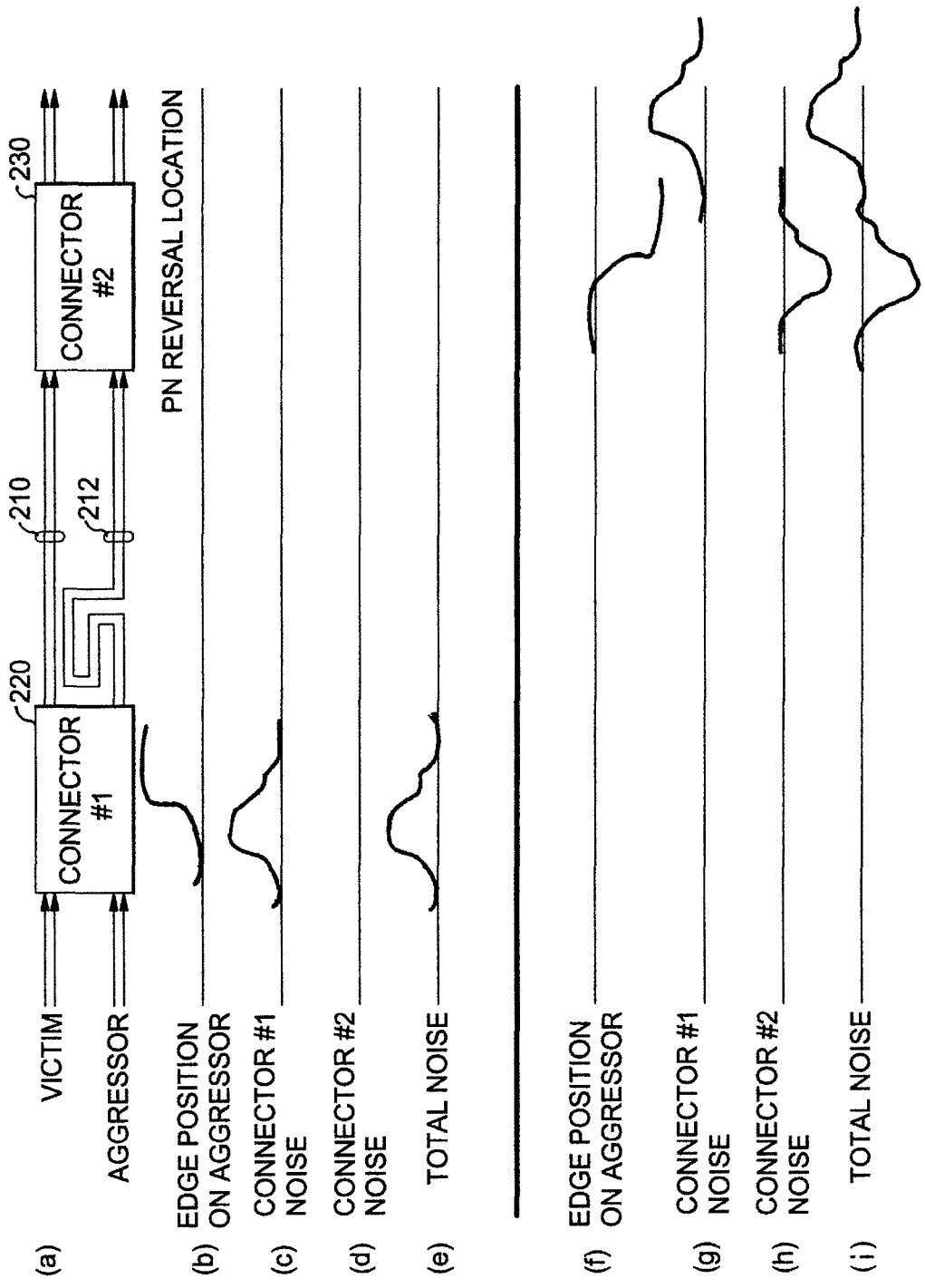
FIGS. 6(a)-(i) illustrates the selection of an appropriate line for the PN reversal to maximize cancellation of noise; and, FIG. 7 illustrates the selection of connector configurations to maximize cancellation of noise.

At FIG. 5, line 14 represents the voltage level of the total noise for the signal present in the prior art system 100 of FIG. 1. Line 24 represents the voltage level of the total noise for the signal present in the system 200 of FIG. 3. In the embodiment shown, the noise level spikes at approximately 0.12 ms, though this can occur at other times. As shown, the conventional system (FIG. 1) line 14 is at about 12 mv at 0.12 ms, whereas the present invention voltage level line 24 is 1.2 mv, which is approximately 10% of the conventional system.

Referring back to FIG. 3(a), it should be noted that the reverse connection of the aggressor trace pair 201 prior to the first connector 220 will not have the desired noise cancellation effect achieved by the reverse connection of the trace pair 212. That is, if the aggressor pair 201 before the first connector 220 is reversed, and the pairs 203, 210, 212 are all straight connections, the noise generated at the connectors 220, 230 will not cancel each other out. That is because the noise will be the same polarity (i.e., negative) at each of the first and second connectors 220, 230, so that the total noise will be a doubled negative value. Likewise, the reversal of the lines 205, 207 after the second connector 230 will not operate to cancel the noise from the first connector 220.

It should also be noted that the line length of the aggressor trace should substantially match the line length of the victim trace in order to attain maximum forward crosstalk cancellation. The tolerance between the lengths matching one another depends on the bit time or the width of the crosstalk pulse. For longer etch lengths, the losses in the etch widens the crosstalk pulse in time. Since the crosstalk pulse has a larger time window, the tolerance to match the etch lengths between the victim and the aggressor is relaxed. On long traces, the noise pulse gets very wide in time. It is easier to align two very wide pulses with low amplitude than two narrow pulses with high amplitude.

For an aggressor trace length of about 13 inches, the matching trace length of the victim trace must be within about 1 inch, or from 12-14 inches in length. Thus, for instance, a 10 gb signal has 100 picosecond bit time, so the signals on the aggressor and victim lines must be within 25 picoseconds of each other. Otherwise, the noise on the first and second connectors 220, 230 might not fully align with one another, and will not cancel each other.

An example of this is shown in FIGS. 6(a)-(i). Here, the aggressor line pair 212 between the connectors 220, 230 has a substantially different length than the victim trace pair 210. As a result, the noise from connector 220, FIG. 6(g), does not align with the noise from connector 230, FIG. 6(h). Thus, the noises won't be guaranteed to cancel each other, but instead both noises will be present from both of the connectors, 220, 230, FIG. 6(i).

In the embodiment of FIG. 3, the line pairs 201, 203 prior to the first connector 220 need not be the same length as each other, and the line pairs 205, 207 after the second connector 230 need not be the same length as each other. However, the victim line pair 210 should be substantially the same length as the aggressor line pair 212 between the connectors 220, 230, as discussed with respect to FIG. 6. And, each of the traces 244, 246 of the aggressor pair 212, as well as the traces 240, 242 of the victim pair 210, should be approximately the same length. However, it should be noted that the traces of each pair, such as traces 245 and 247, need not be routed near each other and can be routed separate from one another. And the traces of neighboring pairs need not be routed next to each other. Thus, as shown in FIG. 2 for instance, trace 244 cancels trace 242, even though those traces are routed apart from one another.

Figure 7:
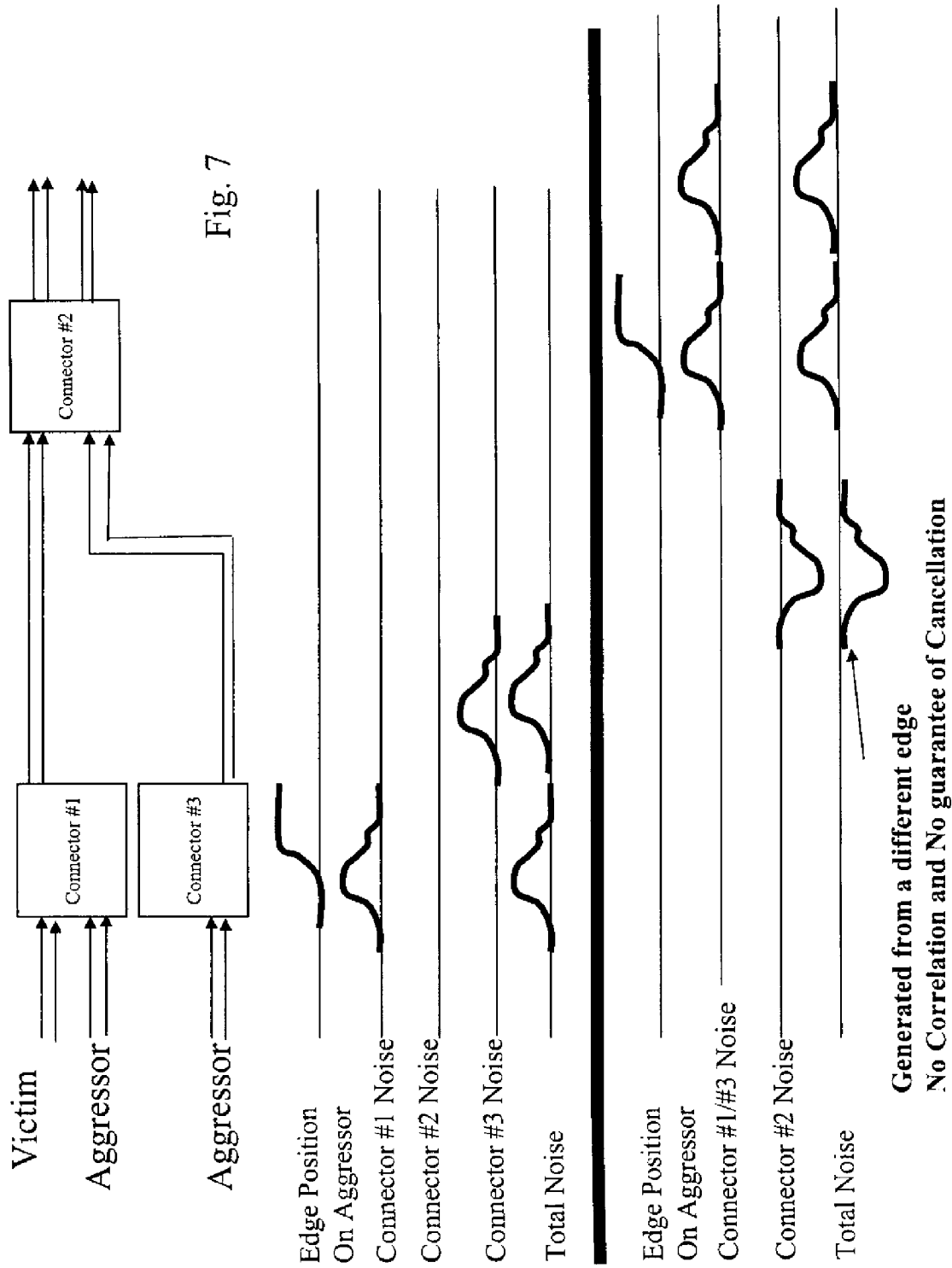

In addition, the present invention is most effective where the connectors 220, 230 are arranged in a symmetric and serial fashion. For instance, with reference to FIG. 7, two connectors are shown connected in parallel to the connector 230. The noise from the first connector 220 is not guaranteed to be canceled by the noise at the second connector 230. Rather, as shown in the illustrative embodiment, the noise from connectors 1 and 3 can be offset in time, or combined to increase. The noise from connector 2 does not align to offset the connector 1 and 3 noise.

Though the preferred embodiment of the invention is implemented on a backplane or daughter card to connect two connectors, it should be apparent that the invention has other uses. For instance, the invention can be used when connecting any two electronic elements on a board.

The foregoing description and drawings should be considered as illustrative only of the principles of the invention. The invention may be configured in a variety of manners and is not intended to be limited by the preferred embodiment. Numerous applications of the invention will readily occur to those skilled in the art. For instance, though only two connectors 220, 230 are shown in the illustrative embodiments, additional connectors can be utilized. Preferably, there is an even number of connectors so that the noise at one connector is canceled by the noise at the next or prior connector. In addition, a reverse connection need not be provided for every straight connection. Therefore, it is not desired to limit the invention to the specific examples disclosed or the exact construction and operation shown and described. Rather, all suitable modifications and equivalents may be resorted to, falling within the scope of the invention.

I claim:

1. A connection system for connecting a first connector with a second connector on a connection device, the system comprising:
   a first differential signal pair having a first signal line on the connection device connected from a positive connection on the connection device of the first connector to a positive connection on the connection device of the second connector and a second signal line on the connection device connected from a negative connection on the connection device of the first connector to a negative connection of the second connector, and
   a second differential signal pair having a first signal line on the connection device connected from another positive connection on the connection device of the first connector to another negative connection on the connection device of the second connector and a second signal line on the connection device connected from another negative connection on the connection device of the first connector to another positive connection on the connection device of the second connector.

2. The connection system of claim 1, wherein said first differential signal pair is substantially the same length as said second differential signal pair.

3. The connection system of claim 1, wherein the positive and negative signal connections of the first differential signal pair at the first and second connectors is adjacent and imparts noise to the another positive and negative signal connections of the second differential signal pair at the first and second connectors.

4. A connection system for a first connector having a negative signal connection and a positive signal connection and a second connector having a negative signal connection and a positive signal connection, the system comprising:
   a first differential signal pair having a first signal line with a first end connected to the negative signal connection of the first connector and a second end connected to the negative signal connection of the second connector, and a second signal line with a first end connected to the positive signal connection of the first connector and a second end connected to the positive signal connection of the second connector; and,
   a second differential signal pair having a first signal line with a first end connected to the negative signal connection of the first connector and a second end connected to the positive signal connection of the second connector, and a second signal line with a first end connected to the positive signal connection of the first connector and a second end connected to the negative signal connection of the second connector.

5. The connection system of claim 4, wherein said first differential signal pair is substantially the same length as said second differential signal pair.

6. The connection system of claim 4, wherein the positive and negative signal connections of the first differential signal pair at the first and second connectors is adjacent and imparts noise to the another positive and negative signal connections of the second differential signal pair at the first and second connectors.

7. The connection system of claim 4, wherein a first crosstalk is realized at the first connector and a second crosstalk is realized at the second connector, and the second crosstalk substantially cancels the first crosstalk.

8. The connection system of claim 4, further comprising:
   a third differential signal pair having a first signal line with a first end connected to the negative signal connection of the first connector and a second end connected to the negative signal connection of the second connector, and a second signal line with a first end connected to the positive signal connection of the first connector and a second end connected to the positive signal connection of the second connector; and, a fourth differential signal pair having a first signal line with a first end connected to the negative signal connection of the first connector and a second end connected to the positive signal connection of the second connector, and a second signal line with a first end connected to the positive signal connection of the first connector and a second end connected to the negative signal connection of the second connector.

9. The connection system of claim 8, wherein said first differential signal pair is adjacent the second differential signal pair, which is adjacent the third differential signal pair, which is adjacent the fourth differential signal pair.

10. A connection system comprising:
a first connector having a first negative signal connection, a second negative signal connection, a first positive signal connection and a second positive signal connection;
a second connector having a first negative signal connection, a second negative signal connection, a first positive signal connection and a second positive signal connection;
a first differential signal pair having a first signal line with a first end connected to the first negative signal connection of the first connector and a second end connected to the first negative signal connection of the second connector, and a second signal line with a first end connected to the first positive signal connection of the first connector and a second end connected to the first positive signal connection of the second connector; and,
a second differential signal pair having a first signal line with a first end connected to the second negative signal connection of the first connector and a second end connected to the second positive signal connection of the second connector, and a second signal line with a first end connected to the second positive signal connection of the first connector and a second end connected to the second negative signal connection of the second connector.

11. The connection system of claim 10, wherein the first negative and positive signal connections of the first connector are adjacent to the second negative and positive signal connections of the first connector, and the first negative and positive signal connections of the first connector are adjacent to the second negative and positive signal connections of the second connector.

12. The connection system of claim 10, wherein said first differential signal pair is substantially the same length as said second differential signal pair.

13. The connection system of claim 10, wherein the first differential signal pair is adjacent the second differential signal pair and the second differential signal pair imparts noise to the first differential signal pair.

14. The connection system of claim 10, wherein a first crosstalk is realized at the first connector and a second crosstalk is realized at the second connector, and the second crosstalk substantially cancels the first crosstalk.

15. A connection system for use with a first electronic element and a second electronic element, the system comprising a plurality of differential signal pairs, the differential signal pairs forming an alternating pattern of differential signal pairs having a straight connection between the first and second electronic elements and differential signal pairs having a reverse connection between the first and second electronic elements, wherein the straight connection is formed by having a first signal line connected from a positive connection in the first electronic element to a positive connection in the second electronic element, and a second signal line connected from a negative connection in the first electronic element to a negative connection in the second electronic element, and the reverse connection is formed by a first signal line connected from a positive connection in the first electronic element to a negative connection in the second electronic element and a second signal line connected from a negative connection in the first electronic element to a positive connection in the second electronic element.

16. A method for connecting a first connector with a second connector, the method comprising connecting a first signal line of a first differential signal pair from a positive connection of the first connector to a positive connection of the second connector; connecting a second signal line of the first differential signal pair from a negative connection of the first connector to a negative connection of the second connector, connecting a first signal line of a second differential signal pair from another positive connection of the first connector to another negative connection of the second connector, and connecting a second signal line of the second differential signal pair from another negative connection of the first connector to another positive connection of the second connector.

17. The method of claim 16, wherein said first differential signal pair is substantially the same length as said second differential signal pair.

18. The connection system of claim 16, wherein the positive and negative signal connections of the first differential signal pair at the first and second connectors is adjacent and imparts noise to the another positive and negative signal connections of the second differential signal pair at the first and second connectors.

19. The method of claim 16, wherein a first crosstalk is realized at the first connector and a second crosstalk is realized at the second connector, and the second crosstalk substantially cancels the first crosstalk.

* * * * *